United States Patent
Sommer et al.

(10) Patent No.: US 6,717,788 B2
(45) Date of Patent: Apr. 6, 2004

(54) TEMPERATURE-PROTECTED SEMICONDUCTOR CIRCUIT CONFIGURATION

(75) Inventors: Peter Sommer, München (DE); Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 346 days.

(21) Appl. No.: 09/784,766

(22) Filed: Feb. 15, 2001

(65) Prior Publication Data

US 2001/0021093 A1 Sep. 13, 2001

(30) Foreign Application Priority Data

Feb. 15, 2000 (DE) ......................... 100 06 526

(51) Int. Cl.⁷ ................................. H02H 5/04
(52) U.S. Cl. ..................................... 361/103
(58) Field of Search .................. 361/25–27, 93.8, 361/103, 106; 324/501, 760, 702, 703, 105; 323/907; 700/299

(56) References Cited

U.S. PATENT DOCUMENTS 6,061,221 A * 5/2000 Tihanyi ..................... 361/103
6,271,880 B1 * 8/2001 Kameshima et al. ........ 348/244

* cited by examiner

*Primary Examiner*—Ronald W. Leja
(74) *Attorney, Agent, or Firm*—Laurence A. Greenberg; Werner H. Stemer; Gregory L. Mayback

(57) ABSTRACT

A temperature-protected semiconductor circuit configuration that has an integrated switching unit. The switching unit is formed of a semiconductor switch, a first integrated temperature sensor for driving the semiconductor switch when an over-temperature is reached, first and second connecting terminals for connecting a load, and a control terminal for applying a drive signal for the semiconductor switch. A second temperature sensor is connected in a heat-conducting manner to the switching unit which exhibits at least one output terminal for providing a temperature-dependent temperature signal.

5 Claims, 1 Drawing Sheet

TEMPERATURE-PROTECTED SEMICONDUCTOR CIRCUIT CONFIGURATION

BACKGROUND OF THE INVENTION

Field of the Invention

The present invention relates to a temperature-protected semiconductor circuit configuration having an integrated switching unit. The integrated switching unit has a semiconductor switch and a first integrated temperature sensor connected to and driving the semiconductor switch if an over-temperature condition is detected. A first connecting terminal is connected to the semiconductor switch and is to be connected to a load. A second connecting terminal is connected to the semiconductor switch, and a control terminal is provided for applying a drive signal to the semiconductor switch.

Integrated switching units containing a semiconductor switch and an integrated temperature sensor for actuating the semiconductor switch in the case of overtemperature are, for example, integrated power semiconductor switches that are sold by the Infineon Technologies AG by the names of HITFET or PROFET.

A temperature sensor monolithically integrated in the same chip as the semiconductor switch detects the temperature directly in the chip in the switching units and thus provides for fast, virtually undelayed turning-off of the semiconductor switch before a high temperature is reached which permanently damages the switching unit. In the PROFET, a status signal is also output which indicates the switching state of the semiconductor switch.

In some of the known switching units, for example the HITFET, the semiconductor switch turns off due to the temperature, and no corresponding status signal is passed to the outside. When a number of such interconnected switching units are used in an application such as, for example, a bridge circuit for driving a motor, the early recognition of a temperature-related turnoff of a semiconductor switch in a switching unit makes sense so that, if necessary, the other switching units can be suitably actuated even before the temperature limit for an automatic turn-off is reached.

Providing a capability for outputting a status signal in the case of a temperature-related turn-off of the semiconductor switch would require a new configuration of the entire switching unit. The detection of the switching state from the outside for generating a status signal is currently performed by voltage detection at the load terminals of the switching unit or by a shunt connected in series with the load terminals.

In power switches of the PROFET family, a status signal is generated and delivered to the outside, which indicates the automatic turn-off of the semiconductor switch. In these power switches, a turn-off can be due both to an over-temperature in the chip and to a short circuit in the load to be switched, which is detected by an evaluation of the voltage across the semiconductor switch. The status signal does not allow any distinction with respect to the fault that has occurred. In the case of an automatic turn-off of the semiconductor switch due to the integrated temperature sensor, the semiconductor switch also turns on again automatically when the component has cooled down, and the status signal also changes its state. The status signal thus changes its state with the heating and subsequent cooling cycle of the switching unit, which makes it more difficult to evaluate it.

SUMMARY OF THE INVENTION

It is accordingly an object of the invention to provide a temperature-protected semiconductor circuit configuration that overcomes the above-mentioned disadvantages of the prior art devices of this general type, in which a switching unit with an integrated temperature sensor is used and in which an over-temperature in the switching unit can be detected from the outside.

With the foregoing and other objects in view there is provided, in accordance with the invention, a temperature-protected semiconductor circuit configuration containing an integrated switching unit. The integrated switching unit has a semiconductor switch, a first integrated temperature sensor connected to and driving the semiconductor switch if an over-temperature condition is detected, a first connecting terminal connected to the semiconductor switch and to be connected to a load, a second connecting terminal connected to the semiconductor switch, and a control terminal for applying a drive signal to the semiconductor switch. A second temperature sensor is connected in a heat-conducting manner to the integrated switching unit and has at least one output terminal outputting a temperature-dependent temperature signal.

Accordingly, the semiconductor circuit configuration has a switching unit with an integrated first temperature sensor and a second temperature sensor, the second temperature sensor being connected to the switching unit in a heat-conducting manner. For this purpose, the second temperature sensor is preferably mounted directly on the chip of the switching unit. To produce a thermally conductive connection between the temperature sensor and the chip of the switching unit, the temperature sensor is attached to the chip of the switching unit, for example by a thermally conductive adhesive, or by screws, clamps or the like. The first monolithically integrated temperature sensor, which detects the temperature directly in the semiconductor body of the integrated switching unit, provides for a fast turn-off of the semiconductor switch in the case of an over-temperature condition. The second temperature sensor detects the temperature on the surface of the semiconductor body and is used for providing a temperature signal that reproduces the temperature conditions in the switching unit. Because heat propagation takes time, the second temperature sensor responds more slowly than the integrated first temperature sensor. However, a time delay in providing the temperature signal is acceptable since, when the temperature signal indicating an over-temperature is generated, the semiconductor switch is usually already turned off so that there is no risk of damage to the semiconductor switch.

In accordance with an added feature of the invention, a drive circuit is connected to the control terminal of the integrated switching unit and to the output terminal of the second temperature sensor.

In accordance with an additional feature of the invention, the second temperature sensor is mounted directly on the switching unit.

In accordance with another feature of the invention, the second temperature sensor is bonded to the integrated switching unit in a dielectrically insulated manner and by a thermally conductive adhesive.

In accordance with a further feature of the invention, screws are used for attaching the second temperature sensor to the integrated switching unit.

In accordance with a concomitant feature of the invention, clamps are used for attaching the second temperature sensor to the integrated switching unit.

Furthermore, it is recognized that the switching unit can be a conventionally or commercially available switching unit having the integrated temperature sensor.

Other features which are considered as characteristic for the invention are set forth in the appended claims.

Although the invention is illustrated and described herein as embodied in a temperature-protected semiconductor circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
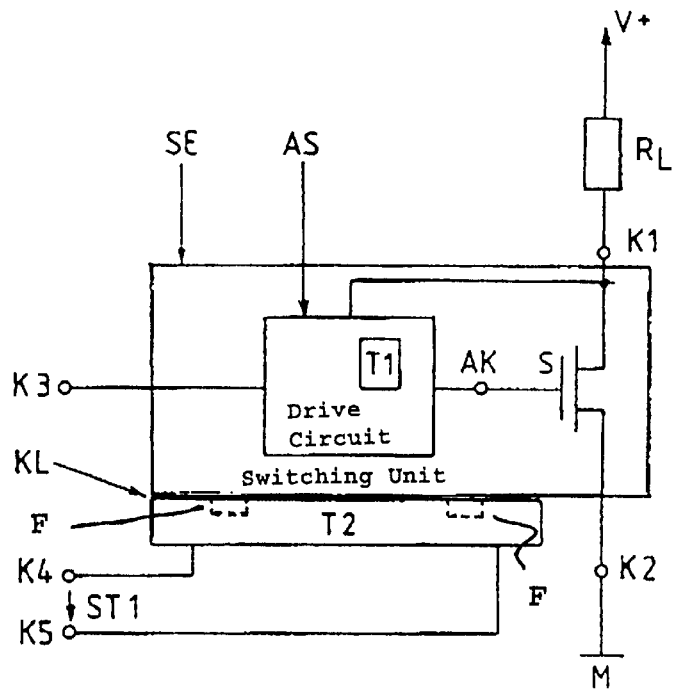
FIG. 1 is a block circuit diagram of a temperature-protected semiconductor circuit configuration according to a first embodiment of the invention.

In all the figures of the drawing, sub-features and integral parts that correspond to one another bear the same reference symbol in each case. Referring now to the figures of the drawing in detail and first, particularly, to FIG. 1 thereof, there is shown a first exemplary embodiment of a temperature-protected semiconductor circuit configuration according to the invention. The circuit configuration has a switching unit SE which has first and second connecting terminals K1, K2 for connecting a load $R_L$ to a voltage present between a reference potential M and a supply potential V+. The switching unit SE has a semiconductor switching element S which is preferably constructed as a power MOSFET, load connecting terminals of the semiconductor switch S being connected between the first and second terminals K1, K2. To drive the semiconductor switch S, the exemplary embodiment provides a drive circuit AS which is connected to an input terminal K3 for supplying a drive signal and an output terminal AK for providing a control signal for the semiconductor switch S. The semiconductor switch S and the drive circuit AS are monolithically integrated in a semiconductor body.

The drive circuit AS has a first monolithically integrated temperature sensor T1 for detecting a temperature in the semiconductor body and for turning off the semiconductor switch S when a predeterminable over-temperature condition occurs. Due to the monolithic integration of the first temperature sensor T1 in the semiconductor body, in which the semiconductor switch S is also constructed, the first temperature sensor T1 responds very quickly to a too high temperature which could permanently damage the switching unit SE, and turns off the semiconductor switch S. A status signal that indicates the switching state of the semiconductor switch S is not generated by the switching unit SE according to FIG. 1. The switching unit shown is, for example, a commercially available HITFET which is sold by Infineon Technologies AG.

According to the invention, a second temperature sensor T2 is provided which is connected in a thermally conducting manner to the switching unit SE, in particular to the semiconductor body of the switching unit SE in which the first temperature sensor T1 and the semiconductor switch S are monolithically integrated.

To produce the thermally conducting connection between the semiconductor body of the switching unit SE and the second temperature sensor T2, the second temperature sensor T2 is preferably mounted directly on the semiconductor body of the switching unit SE or on a housing surrounding the semiconductor body of the switching unit SE. According to one embodiment, the second temperature sensor T2 is attached to the semiconductor body or to the housing by a thermally conducting adhesive KL as shown diagrammatically in FIG. 1. In other embodiments of the invention, it is provided to attach the second temperature sensor by fasteners F such as screws, clamps or similar devices for producing tight connections to the semiconductor body of the switching unit SE or to a housing surrounding the semiconductor body.

The second semiconductor body is preferably also integrated in a semiconductor body which is attached directly to the semiconductor body of the switching unit SE or to its housing by bonding, screwing, clamping or the like.

The second temperature sensor T2 exhibits connecting terminals K4, K5 at which a temperature signal or status signal ST1 can be picked up, the status signal preferably assuming one of two different values depending on whether a temperature detected by the second temperature sensor T2 is above or below a predeterminable temperature threshold. The temperature information supplied by the temperature signal ST1 of the second temperature sensor T2 can be used for turning off the semiconductor switch S via the connecting terminal K3 in order to prevent the semiconductor switch S from automatically turning on again when the temperature at the first integrated temperature sensor T1 has dropped below the temperature threshold.

However, the temperature signal ST1 of the second temperature sensor T2 can also be used for turning off or suitably actuating other such semiconductor circuit configurations, not shown in greater detail in FIG. 1, which are interconnected with the semiconductor circuit configuration at which an over-temperature condition has occurred.

Figure 2:
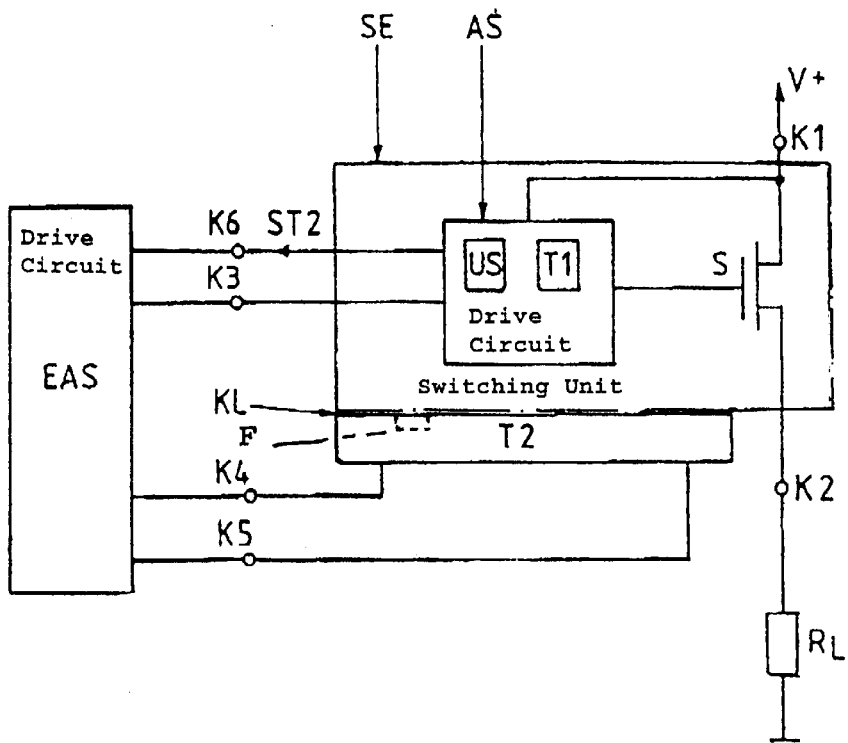
FIG. 2 is a block circuit diagram of the temperature-protected semiconductor circuit configuration according to a second embodiment of the invention.

FIG. 2 shows another embodiment of the semiconductor switch configuration according to the invention. In this embodiment, the switching unit SE exhibits a further connecting terminal K6 at which a status signal ST2 can be picked up, which represents the switching state of the semiconductor switch S. In addition to the first monolithically integrated temperature sensor T1, the drive circuit AS of the semiconductor switch S in the exemplary embodiment has a voltage sensor US which evaluates a voltage across a load gap of the semiconductor switch S in order to turn off the semiconductor switch S in the case of a short circuit in the load $R_L$ and to protect it against destruction. The status signal ST2 present at connecting terminal K6 does not reveal whether the connection of the semiconductor switch S is due to the voltage sensor US or the temperature sensor T1. The temperature signal supplied by the second temperature sensor T2, which only depends on the temperature at the semiconductor body of the switching unit SE, enables the status signal ST2 at the connecting terminal K6 to be distinguished with respect to these two cases.

FIG. 2 also shows an external drive circuit EAS that is connected to the connecting terminals K4, K5 of the second temperature sensor T2 and to the connecting terminals K3, K6 of the switching unit SE. The external drive circuit EAS is used for driving the semiconductor switch S via the drive circuit AS, taking into consideration the status signal ST2 supplied by the switching unit SE at the connecting terminal K6 and the temperature signal ST1 supplied by the second temperature sensor at the connecting terminals K4, K5.

The switching unit according to FIG. 2 is, for example, a commercially available PROFET that is sold by the Infineon Technologies AG.

We claim:

1. A temperature-protected semiconductor circuit configuration, comprising:
   an integrated switching unit, including:
   a semiconductor switch;
   a first integrated temperature sensor connected to and driving said semiconductor switch if an over-temperature condition is detected;
   a first connecting terminal connected to said semiconductor switch and to be connected to a load;
   a second connecting terminal connected to said semiconductor switch; and
   a control terminal for applying a drive signal to said semiconductor switch; and
   a second temperature sensor disposed directly on, but externally of and connected in a heat-conducting manner to said integrated switching unit and having at least one output terminal outputting a temperature-dependent temperature signal.

2. The semiconductor circuit configuration according to claim 1, including a drive circuit connected to said control terminal of said integrated switching unit and to said output terminal of said second temperature sensor.

3. The semiconductor circuit configuration according to claim 1, wherein said second temperature sensor is bonded to said integrated switching unit in a dielectrically insulated manner and by a thermally conductive adhesive.

4. The semiconductor circuit configuration according to claim 1, including screws attaching said second temperature sensor to said integrated switching unit.

5. The semiconductor circuit configuration according to claim 1, including clamps attaching said second temperature sensor to said integrated switching unit.

* * * * *